United States Patent

Kim et al.

[11] Patent Number: 5,955,146
[45] Date of Patent: Sep. 21, 1999

[54] PROCESS FOR THE PREPARATION OF MAGNESIUM OXIDE FILMS USING ORGANOMAGNESIUM COMPOUNDS

[75] Inventors: Yunsoo Kim; Wonyong Koh, both of Daejeon; Sujin Ku, Taegu, all of Rep. of Korea

[73] Assignee: Korea Research Institute of Chemical Technology, Rep. of Korea

[21] Appl. No.: 08/981,388

[22] PCT Filed: Jul. 3, 1996

[86] PCT No.: PCT/KR96/00102

§ 371 Date: Dec. 18, 1997

§ 102(e) Date: Dec. 18, 1997

[87] PCT Pub. No.: WO97/02368

PCT Pub. Date: Jan. 23, 1997

[30] Foreign Application Priority Data

Jul. 4, 1995 [KR] Rep. of Korea .................. 95-19528

[51] Int. Cl.[6] ................................. C23C 16/00
[52] U.S. Cl. .................. 427/255.3; 427/226; 117/944
[58] Field of Search .................. 427/255.3, 226

[56] References Cited

U.S. PATENT DOCUMENTS

| | | | |
|---|---|---|---|
| 4,382,980 | 5/1983 | Donohue | 427/77 |
| 5,258,204 | 11/1993 | Wernberg et al. | 427/255 |
| 5,656,329 | 8/1997 | Hampden-Smith et al. | 427/226 |

OTHER PUBLICATIONS

Ashby et al., A New Convenient, and Stereospecific Method for the Dehydration of Alcohols. The Thermal Decomposition of Magnesium, Zinc, and Aluminum Alkoxides. A Mechanistic Study, J. Org. Chem., vol. 44, No. 8, pp. 1221–1232, Aug. 1979.

Primary Examiner—Shrive Beck
Assistant Examiner—Jennifer Calcagni
Attorney, Agent, or Firm—Anderson Kill & Olick

[57] ABSTRACT

A process for coating the surface of a single crystal with a magnesium oxide film which comprises contacting an organomagnesium compound having an oxygen to magnesium atomic ratio of 1:1 with the crystal heated to a temperature ranging from 300° C. to 450° C. in the absence of oxygen. The magnesium oxide film thus produced has a negligible amount of residual carbon.

6 Claims, No Drawings

PROCESS FOR THE PREPARATION OF MAGNESIUM OXIDE FILMS USING ORGANOMAGNESIUM COMPOUNDS

FIELD OF THE INVENTION

The present invention relates to a process for coating a substrate with a magnesium oxide film using an organomagnesium compound having an oxygen to magnesium atomic ratio of 1:1.

BACKGROUND OF THE INVENTION

Magnesium oxide is a transparent and chemically stable material having good electric insulation property and it does not undergo a phase transition even at a high temperature up to its melting temperature of 2852° C. Magnesium oxide has been used as a substrate for preparing thereon films of a number of inorganic compounds, i.e., various oxides such as cuprate-based high-$T_c$ superconductors, lithium niobate, barium titanate, and nitrides such as gallium nitride, niobium nitride, and the like.

Although large single crystals having uniform properties have been successfully grown for quartz, silicon, gallium arsenide(GaAs), sapphire and the like, a process for preparing large single crystals of high-temperature superconductors has not yet been developed. Also, attempts to prepare a high-temperature superconducting film directly on the surface of quartz, silicon, gallium arsenide or sapphire crystal have not been-successful. However, it is known that a high-temperature superconductor film having excellent property can be prepared via coating a magnesium oxide film on the surface of a single crystal substrate. For example, a copper oxide high-temperature superconductor may be deposited and grown on a magnesium oxide film coated on the surface of a silicon single crystal (D. K. Fork, F. A. Ponce, J. C. Tramontana, and T. H. Geballe, *Applied Physics Letters*, 58, 2294 (1991)). It is also known that magnesium oxide can be used as a diffusion barrier which inhibits the reaction between silicon and barium titanate, and the resulting dielectric material may find use in semiconductor memory devices of the next generation.

Hitherto, there have been reported a number of chemical vapor deposition(CVD) methods for the preparation of a magnesium oxide film at a relatively low temperature.

For example, Kwak et al. reported that a crystalline film of magnesium oxide may be prepared on the surface of a silicon single crystal or quartz by heating bis(2,2,6,6-tetramethyl-3,5-heptanedionato)magnesium of formula 1 to 196° C. and carrying the vapor thereof in an argon stream containing oxygen to the substrate heated above 650° C. (B. S. Kwak, E. P. Boyd, K. Zhang, A. Erbil, and B. Wilkins, *Applied Physics Letters*, 54, 2542 (1989)).

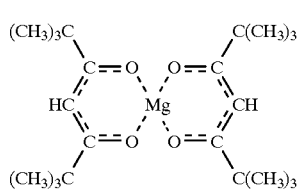

formula 1

Lu et al. disclosed that a crystalline film of magnesium oxide can be prepared on the surface of sapphire or strontium titanate at a temperature below 600° C. by carrying bis(2,2,6,6-tetramethyl-3,5-heptanedionato)magnesium in a helium or argon stream to the substrate and then adding oxygen thereto (Z. Lu, R. S. Feigelson, R. K. Route, S. A. DiCarolis, R. Hiskes, and R. D. Jacowitz, *Journal of Crystal Growth*, 128, 788 (1993)).

Using a plasma-assisted chemical vapor deposition method, Zhao and Suhr prepared crystalline magnesium oxide films on the surfaces of glass, quartz, silicon single crystal and stainless steel by carrying bis(2,2,6,6-tetramethyl-3,5-heptanedionato)magnesium heated at 200° C. in argon stream to the substrate heated above 400° C. and adding oxygen thereto (Y. W. Zhao and H. Suhr, *Applied Physics A*, 54, 451 (1992)).

Maruyama et al., on the other hand, reported that a crystalline magnesium oxide film may be formed on the surface of glass, quartz or silicon single crystal by treating the substrate heated above 450° C. with an air stream containing magnesium 2-ethylhexanoate of formula 2 (T. Maruyama and J. Shionoya, *Japanese Journal of Applied Physics*, 29, L810 (1990)). It was reported therein that a magnesium oxide film did not form when the carrier gas was nitrogen instead of air.

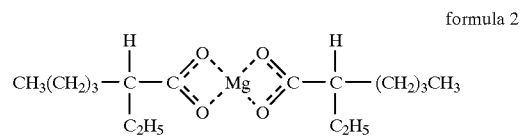

formula 2

According to DeSisto and Henry, an amorphous magnesium oxide film was deposited on the surface of a silicon single crystal, quartz or sapphire by ultrasonic spraying of an

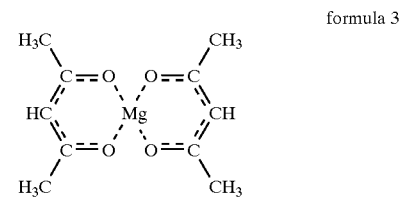

formula 3 aqueous or alcoholic solution of bis(2,4-pentanedionato) magnesium of formula 3 to the substrate heated at 400–550° C. (W. J. DeSisto and R. L. Henry, *Applied Physics Letters*, 56, 2522 (1990); W. J. DeSisto and R. L. Henry, *Journal of Crystal Growth*, 109, 314 (1991)). The amorphous magnesium oxide film thus obtained was subsequently converted to a crystalline form by annealing at 700° C. under an oxygen atmosphere.

In the above-mentioned CVD methods, the use of oxygen is essential for the formation of a magnesium oxide film. The magnesium compounds cited above have a magnesium to oxygen atomic ratio of 1:4. As the corresponding ratio in magnesium oxide is 1:1, the formation of a magnesium oxide film must be accompanied by the removal of three equivalent amount of oxygen together with all of the carbon and hydrogen atoms that constitute the organic moieties. It is not well understood at this time exactly how such organomagnesium compounds convert to form a magnesium oxide film in the presence of oxygen, while eliminating the extra oxygen as well as the carbon and hydrogen atoms. However, the magnesium oxide films produced by the prior art methods tend to be contaminated by a significant amount of residual carbon, the residual carbon imparting undesirable effects to the property of the magnesium oxide film.

By using the above-mentioned plasma-assisted CVD method of Zhao and Suhr, a crystalline magnesium oxide film containing little carbon may be obtained below 400° C., the lowest temperature reported in the prior art methods. However, the plasma-assisted CVD method requires a high-power radiofrequency wave generator to produce a plasma as well as sophisticated techniques to generate a uniform plasma over the entire surface of the substrate. Moreover, the plasma CVD method has a serious disadvantage in that the deposition of magnesium oxide occurs only on the surface exposed to the plasma, in contrast to a thermal CVD process wherein film deposition occurs on all surfaces of the substrate. Accordingly, the throughput of plasma-assisted CVD method is much lower than that of thermal CVD method, thus less suitable for use in a large-scale production.

Recently, Auld et al. have reported that a zinc oxide film containing little residual carbon can be coated on the surface of glass heated at 250–400° C. by a chemical vapor deposition method using alkylzinc alkoxides in the absence of oxygen (J. Auld, D. J. Houlton, A. C. Jones, S. A. Rushworth, M. A. Malik, P. O'Brien, and G. W. Critchlow, *Journal of Materials Chemistry*, 4, 1249 (1994)). This is in line with the results obtained by Ashby et al. that zinc oxide or magnesium oxide is obtained as a by-product when alkylzinc alkoxide or alkylmagnesium alkoxide is pyrolyzed, in accordance with the following reaction paths (E. C. Ashby, G. F. Willard, and A. B. Goel, *Journal of Organic Chemistry*, 44, 1221 (1979)).

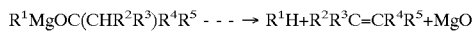
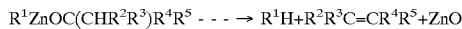

A pyrolytic decomposition reaction is proposed to proceed via a unimolecular mechanism involving a six-membered ring transition state, as described below. Ashby et al. reported that sublimation also occurs as the pyrolytic decomposition proceeds when methylmagnesium t-butoxide is heated;

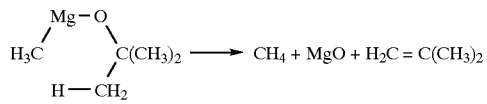

Such alkylmagnesium alkoxide has not been used in the prior art CVD method for the preparation of a magnesium oxide film, presumably because the reaction was unknown to materials scientists of this field until J. Auld mentioned E. C. Ashby et al.'s results in their paper and the alkylmagnesium alkoxides were not readily available. The present inventors nonetheless considered it attractive to use an alkylmagnesium alkoxide as a precursor for a clean, pure magnesium oxide film depositable on a single crystal substrate by a CVD method.

SUMMARY OF THE INVENTION

Accordingly, it is an object of the present invention to provide a new, simple process for the preparation of a magnesium oxide film coated on a single crystal substrate, said film having a negligible amount of residual carbon.

It is another object of this invention to provide a single crystal coated with a magnesium oxide film, said magnesium oxide film being characterized by a negligible residual carbon content.

In accordance with one aspect of the present invention, there is provided a process for coating a substrate with a magnesium oxide film, which comprises contacting an organomagnesium compound having an oxygen to magnesium atomic ratio of 1:1 with said substrate heated to a temperature above 250° C., preferably.

DETAILED DESCRIPTION OF THE INVENTION

The organomagnesium compound suitable for use in the present invention contains magnesium and oxygen atoms in a ratio of 1:1, and is preferably sublimed at 150° C. or below. A particularly preferable organomagnesium compound in practicing the present invention is an alkylmagnesium alkoxide of the formula of R—Mg—OR' wherein R is a $C_{1-4}$ alkyl group and R' is a $C_{2-8}$ alkyl group, more preferably, R is methyl or ethyl and R' is a $C_{2-4}$ alkyl group, and most preferably, R is methyl and R' is t-butyl group.

Alkylmagnesium alkoxide derivatives suitable for use in the present invention may be synthesized according to the known methods e.g., the method disclosed by Ashby (E. C. Ashby, J. Nackashi, and G. E. Parris, *Journal of American Chemical Society*, 97, 3162 (1975); S. Gupta, S. Sharma, and A. K. Narula, *Journal of Organometallic Chemistry*, 452, 1 (1993)).

In accordance with one aspect of the present invention, an organomagnesium compound may be sublimed at 60–150° C. and the vapor thereof may be contacted with the surface of a substrate heated at a temperature above 250° C., preferably at a temperature ranging from 300 to 450° C. to deposit a magnesium oxide film thereon. The temperature of the organomagnesium compound vapor is preferably maintained below 150° C., preferably below 100° C., before it comes in contact with the substrate. The pressure may be maintained in the range $10^{-5}$–$10^{-4}$ mbar initially, but depending on the equipment used, the internal pressure may rise to a level which is 2–10 times the initial value as the magnesium oxide deposition reaction proceeds.

A substrate which may be used in practicing the present invention is any inorganic solid that is stable above the film deposition temperature, e.g., 350° C., and examples thereof include glass, quartz, silicon, gallium arsenide, sapphire, alkali metal niobate, alkaline earth metal titanate, gallium nitride, niobium nitride and the like, among which single crystals of silicon and gallium arsenide are preferred when the coated substrate is intended for use in electronic applications.

The magnesium oxide film deposited on a single crystal substrate in accordance with the process of this invention is characterized by its low residual carbon content; much lower than those found in magnesium oxide films prepared by prior art methods. This beneficial effect of the inventive process is likely due to the clean, facile nature of the alkylmagnesium alkoxide decomposition reaction that occurs at a relatively low temperature. The deposition of a magnesium oxide film is accompanied by the formation of well-defined by-products, an alkane and an olefin which are easily removable from the substrate and do not easily convert to a carbonaceous residue.

The following Examples and Comparative Examples are provided for the purposes of illustrating certain aspects of the present invention only; they are not to be construed as limiting the scope of the present invention in any way.

In each of the Examples and Comparative Examples, the coated substrate obtained after the organomagnesium compound treatment was immediately transferred into an X-ray photoelectron spectroscope in order to minimize the exposure thereof to air.

EXAMPLE 1

Methylmagnesium t-butoxide was evaporated at 60° C. and decomposed on a Si(100) substrate at 400° C. without using a carrier gas. An interference color of violet appeared on the surface after 1.3 hours, and at this point, the chemical vapor deposition was stopped. The X-ray photoelectron(XP) spectrum of the deposited film showed peaks corresponding to oxygen and magnesium as well as carbon, but not the peaks for silicon. This observation shows that the surface of the silicon substrate is completely covered by a magnesium oxide film. The elemental composition of the film surface measured by comparing the photoelectron peak areas corresponded to an atomic ratio of Mg:O:C=1.00:1.17:0.38. The X-ray diffraction pattern of the deposited film showed peaks at 2θ=36.96, 42.98, 62.36°, suggesting that the magnesium oxide film is crystalline.

EXAMPLE 2

Methylmagnesium t-butoxide was evaporated at 60° C. and decomposed on a Si(100) substrate at 350° C. for 18.5 hours. In this case, the peaks for silicon(the substrate) besides those for magnesium, oxygen and carbon were observed in the XP spectrum of the deposited film. The ratio of the elements in the film surface was Mg:O:C:Si= 1.00:0.92:0.28:0.43. This result suggests that either the magnesium oxide film obtained in this example is very thin or the substrate is not completely coated by magnesium oxide.

EXAMPLE 3

Methylmagnesium t-butoxide was evaporated at 60° C. and decomposed on a Si(100) substrate at 300° C. for 19 hours. The peaks for silicon besides those for magnesium, oxygen and carbon were observed in the XP spectrum of the deposited film. The ratio of the elements in the film surface was Mg:O:C:Si=1.00:1.28:0.62:1.15.

EXAMPLE 4

Methylmagnesium t-butoxide was evaporated at 60° C. and decomposed on a GaAs(100) substrate at 400° C. for 5 hours. The peaks for gallium and arsenic were not observed in the XP spectrum, which shows that the substrate is completely covered by a magnesium oxide film. The measured ratio of the elements in the film was Mg:O:C= 1.00:1.12:0.38.

EXAMPLE 5

Methylmagnesium isopropoxide was evaporated at 60° C. and decomposed on a Si(100) substrate at 400° C. for 3 hours. The ratio of the elements in the film surface was measured to be Mg:O:C:Si=1.00:0.91:0.31:0.02. This result suggests that the surface of the silicon substrate is almost completely covered by a magnesium oxide film.

EXAMPLE 6

Ethylmagnesium t-butoxide was evaporated at 110° C. and decomposed on a Si(100) substrate at 400° C. for 3 hours. The peaks for silicon were not observed in the XP spectrum, which shows that the surface of the silicon substrate is completely covered by a magnesium oxide film. The ratio of the elements in the film surface was measured to be Mg:O:C=1.00:1.13:0.56.

Comparative Example 1

Bis(2,2,6,6-tetramethyl-3,5-heptanedionato)magnesium was evaporated at 90° C. and attempts were made to decompose it on a Si(100) substrate at 400° C. for 9 hours. No visual change of the substrate surface was observed during the 9-hour period. Only a trace peak for magnesium was observed in the XP spectrum (Si:Mg=1.00:0.01), which shows that a magnesium oxide film is not formed under the conditions of this Comparative Example.

Comparative Example 2

Bis(2,2,6,6-tetramethyl-3,5-heptanedionato)magnesium was evaporated at 120° C. and carried in an oxygen carrier gas to a Si(100) substrate heated to 500° C. for 2 hours. The peaks for silicon were not observed in the XP spectrum, which shows that the surface of the silicon substrate is completely covered by a magnesium oxide film. The ratio of the elements in the film was Mg:O:C=1.00:1.70:0.69. Although the deposition of the magnesium oxide film was conducted at 500° C. using an oxygen carrier gas, the carbon content thereof was much higher than those of the films of Examples 1–6 wherein the film depositions were conducted at 300–400° C. in the absence of oxygen.

Comparative Example 3

A commercial magnesium oxide single crystal was analyzed with X-ray photoelectron spectroscopy in order to establish a standard for comparison with the magnesium oxide films of Examples 1–6 and Comparative Examples 1–2. The XP spectrum of the magnesium oxide single crystal as received exhibited a large carbon peak. When this magnesium oxide single crystal was washed with a hydrochloric acid solution containing nitric acid and hydrogen peroxide, the carbon peak became much smaller, but did not totally disappear. The ratio of the elements in the surface of the cleaned crystal was Mg:O:C=1.00:1.15:0.25. This ratio, instead of the theoretical ratio of 1:1:0, should be taken as the representative value for an essentially pure magnesium oxide. Based on this criterion, the films produced in Examples 1, 2, 4 and 5 should be judged to be composed of essentially pure magnesium oxide having a low carbon content.

Table 1 summarizes the experimental conditions and the results of Examples and Comparative Examples.

TABLE 1

Preparation of the Magnesium Oxide Films in accordance with the Procedures of Examples and Comparative Examples

| | Magnesium Derivative Used | Carrier gas ($O_2$) | Substrate | T (°C.) | Time (hr) | The Elemental Composition | | | |
|---|---|---|---|---|---|---|---|---|---|
| | | | | | | Mg | O | C | Si |
| Ex. 1 | methylmagnesium t-butoxide | — | Si (100) | 400 | 1.3 | 1.00 | 1.17 | 0.38 | — |
| Ex. 2 | " | — | Si (100) | 350 | 18.5 | 1.00 | 0.92 | 0.28 | 0.43 |
| Ex. 3 | " | — | Si (100) | 300 | 19.0 | 1.00 | 1.28 | 0.62 | 1.15 |

TABLE 1-continued

Preparation of the Magnesium Oxide Films in accordance with the Procedures of Examples and Comparative Examples

| | Magnesium Derivative Used | Carrier gas ($O_2$) | Substrate | T (°C.) | Time (hr) | The Elemental Composition | | | |
|---|---|---|---|---|---|---|---|---|---|
| | | | | | | Mg | O | C | Si |
| Ex. 4 | " | — | GaAs (100) | 400 | 5.0 | 1.00 | 1.12 | 0.38 | — |
| Ex. 5 | methylmagnesium isopropoxide | — | Si (100) | 400 | 3.0 | 1.00 | 0.91 | 0.31 | 0.02 |
| Ex. 6 | ethylmagnesium t-butoxide | — | Si (100) | 400 | 3.0 | 1.00 | 1.13 | 0.56 | 0.56 |
| C.E. 1 | bis(2,2,6,6-tetramethyl-3,5-heptanedionato)magnesium | — | Si (100) | 400 | 9.0 | — | — | — | 1.00 |
| C.E. 2 | bis(2,2,6,6-tetramethyl-3,5-heptanedionato)magnesium | O | Si (100) | 500 | 2.0 | 1.00 | 1.70 | 0.69 | — |
| C.E. 3 | magnesium single crystal | — | — | — | — | 1.00 | 1.15 | 0.25 | — |

In accordance with the present invention as described above, a crystalline magnesium oxide film having a much reduced carbon content may be prepared in the absence of oxygen at a temperature lower than those used in the prior art CVD methods.

While the invention has been described with respect to the specific embodiments, it should be recognized that various modifications and changes may be made by those skilled in the art to the invention which also fall within the scope of the invention as defined by the appended claims.

What is claimed is:

1. A process for coating a substrate with a magnesium oxide film which comprises contacting the vapor of an alkylmagnesium alkoxide of the formula R—Mg—OR' with the substrate heated to a temperature above 250° C., wherein R is a $C_{1-4}$ alkyl group and R' is a $C_{2-8}$ alkyl group, so as to coat the substrate with the magnesium oxide film.

2. The process of claim 1, wherein said substrate is heated at a temperature ranging from 300 to 450° C.

3. The process of claim 1, wherein the organomagnesium compound is sublimable at 150° C. or below.

4. The process of claim 3, wherein the organomagnesium compound is an alkylmagnesium alkoxide of the formula R—Mg—OR', R being methyl or ethyl and R', a $C_{2-4}$ alkyl group.

5. The process of claim 4, wherein R is methyl and R' is t-butyl.

6. The process of claim 1, wherein the substrate is a single crystal of silicon or gallium arsenide.

* * * * *